United States Patent [19]
Russell et al.

[11] Patent Number: 5,962,863
[45] Date of Patent: Oct. 5, 1999

[54] LATERALLY DISPOSED NANOSTRUCTURES OF SILICON ON AN INSULATING SUBSTRATE

[75] Inventors: Stephen D. Russell; Robert C. Dynes; Paul R. de la Houssaye, all of San Diego; Wadad B. Dubbelday, Spring Valley; Randy L. Shimabukuro, San Diego; Andrew S. Katz, La Jolla, all of Calif.

[73] Assignee: The United States of America as represented by the Secretary of the Navy, Washington, D.C.

[21] Appl. No.: 08/528,386

[22] Filed: Sep. 13, 1995

Related U.S. Application Data

[63] Continuation-in-part of application No. 08/118,900, Sep. 9, 1993, abandoned.

[51] Int. Cl.$^6$ .................................................. H01L 29/06
[52] U.S. Cl. ................................. 257/14; 257/9; 257/103
[58] Field of Search ............................. 257/14, 99, 103, 257/79, 22, 9

[56] References Cited

U.S. PATENT DOCUMENTS

| | | |
|---|---|---|
| 4,995,049 | 2/1991 | Kahen et al. . |
| 5,110,760 | 5/1992 | Hsu . |
| 5,136,169 | 8/1992 | Smith et al. . |
| 5,138,174 | 8/1992 | Tang . |
| 5,246,879 | 9/1993 | Hsu et al. . |
| 5,252,835 | 10/1993 | Lieber et al. . |
| 5,288,007 | 2/1994 | Interrante et al. . |
| 5,293,037 | 3/1994 | Le Mehaute et al. . |
| 5,338,430 | 8/1994 | Parsonage et al. . |
| 5,352,651 | 10/1994 | Dede et al. . |
| 5,360,764 | 11/1994 | Celotta et al. . |
| 5,365,073 | 11/1994 | White . |
| 5,409,801 | 4/1995 | Kasowski et al. . |
| 5,414,588 | 5/1995 | Barbee, Jr. et al. . |
| 5,420,049 | 5/1995 | Russell et al. . |
| 5,422,513 | 6/1995 | Marcinkiewicz et al. . |

OTHER PUBLICATIONS

Canham, "Silicon quantum wire array fabrication by electrochemical and chemcial dissolution of wafers", *Appl. Phys. Lett.*, 57 (10), Sep. 3, 1990, pp. 1046–1048.

Richter et al., Current–Induced Light Emission from a Porous Silicon Device, *IEEE Electron Device Letters*, vol. 12, No. 12, Dec. 1991, pp. 691–692.

Lehmann et al., "Porous silicon formation: A quantum wire effect", *Appl. Phys. Lett.*, 58 (8), Feb. 25, 1991, pp. 856–858.

(List continued on next page.)

*Primary Examiner*—Minh Loan Tran
*Attorney, Agent, or Firm*—Harvey Fendelman; Michael A. Kagan; Peter A. Lipovsky

[57] ABSTRACT

A single crystal silicon film nanostructure capable of optical emission is laterally disposed on an insulating transparent substrate of sapphire. By laterally disposing the nanostructure, adequate support for the structure is provided, and the option of fabricating efficient electrical contact structures to the nanostructure is made possible. The method of the invention begins with the deposition of ultrathin layers of silicon on the substrate. A Solid Phase Epitaxy improvement process is then used to remove crystalline defects formed during the deposition. The silicon is then annealed and thinned using thermal oxidation steps to reduce its thickness to be on the order of five nanometers in height. The width and length of the nanostructure are defined by lithography. The nanometer dimensioned silicon is then spin-coated with a resist with width and length definition in the resist being performed by way of electron beam exposure. The photoresist is developed and the e-beam written pattern is transferred to the silicon by etching. Oxidations and etchings may subsequently be employed to further thin the width of the nanostructure to be on the order of two to three nanometers. The single crystal, silicon-based nanostructures can be made an integral part of silicon-based photo, electroluminescent, and quantum-effect devices all of which are compatible with current silicon manufacturing techniques and with other silicon-based microelectronics.

31 Claims, 6 Drawing Sheets

OTHER PUBLICATIONS

Koch et al., "The luninescense of porous Si: the case for the surface state mechanism", *Journal of Luminescense,* 57, 1993, pp. 271–281.

Sanders et al., "Theory of optical properties of quantum wires in porous silicon", *Physical Review B,* vol. 45, No. 16, Apr. 15, 1992–II, pp. 9202–9213.

Ohno et al., "Intrinsic Origin of Visible Light Emission from Silicon Quantum Wires: Electronic Structure and Geometrically Restricted Exciton", *Physical Review Letters,* vol. 69, No. 16, Oct. 19, 1992, pp. 2400–2403.

Liu et al., "Oxidation of sub–50 nm Si columns for light emission study", *J. Vac. Sci. Technol. B,* 10 (6), Nov./Dec. 1992, pp. 2846–2850.

Chou et al., "Lateral resonant tunneling field–effect transistor", *Appl.Phys. Lett.,* 50 (23), Jun. 6, 1988, pp. 1982–1984.

Garcia et al., "Electron Mobility within 100 nm of the Si/Sapphire Interface in Double–Solid–Phase Epitaxially Regrown SoS", *Electronics Letters,* vol. 22, No. 10, May 8, 1986, pp. 537–538.

Sullivan et al., "Precursor and Direct Activated Chemisorption of Chlorine Molecules onto Si(111) (7–7) and Si (100) (2–1) Surfaces", *J. Phys. Chem.,* 97, 1993, pp. 12051–12060.

Xie et al., "Near–field Fluorsecence Microscopy and Spectroscopy: Applications to Single Chromophores, Single Proteins and Photosynthetic Membranes", *SPIE Proceedings 1994,* 2137, (1994), 13 pages.

Liu et al., "Self–limiting oxidation for fabricating sub–5 nm silicon nanowires", *Appl. Phys. Lett.,* 64 (11), Mar. 14, 1994, pp. 1383–1385.

Liu et al., "Self–limiting oxidation of Si nanowires", *J. Vac. Sci. Technol. B,* 11 (6), Nov./Dec. 1993, pp. 2532–2537.

LATERALLY DISPOSED NANOSTRUCTURES OF SILICON ON AN INSULATING SUBSTRATE

CROSS-REFERENCE TO RELATED APPLICATION

This is a continuation-in-part of application Ser. No. 118,900 filed Sep. 9, 1993, now abandoned.

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

This invention relates generally to light-emitting silicon structures and silicon-based photonic devices. In greater particularity, the invention pertains to light-emitting laterally disposed nanostructures of silicon and silicon-based photonic devices made of laterally disposed nanostructures of silicon.

Silicon is the mainstay of the semiconductor integrated circuit industry because of its process maturity, low cost, high yield and high reliability. Its use has been limited, however, in optoelectronic applications by its 1.1 electron-volt (eV) indirect band gap structure which yields only very weak infrared luminescence. As a result, light-emitting devices have been made of Group III-V semiconductors, such as GaAs. Unfortunately such semiconductors cannot be readily integrated with silicon-based electronic technology, which has become well established and comparatively cheap.

The availability of a light-emitting/photonic silicon source would allow a breakthrough in optoelectronic integrated circuits, having applications in optical computing, high-speed communications, and integrated sensor and smart sensor technology. Additional applications could include light-emitting diodes (LEDs), flat-panel displays, and optical interconnections. If these silicon based light-emitting/photonic devices could be monolithically integrated with other structures on silicon, a tremendous advance in silicon-based electronics could be made.

The discovery of photoluminescent porous silicon has caused porous silicon to emerge as a potential photonic source compatible with silicon microelectronics. The porous silicon is of high porosity with very thin remaining wire-like structures that are supported by their ends, these structures sometimes are referred to as quantum wires, see L. T. Canham, *Appl. Phys. Let.*, 57, 1046 (1990). The interest in integrating silicon circuitry with silicon light-emitting (photonic) devices has resulted in the application of porous silicon to electroluminescent devices, see A. Richter, P. Steiner, F. Kowlowski, and W. Lang, *IEEE Elect. Dev. Lett.*, 12, 691 (1991).

Many theories on the origin of the silicon-based bright visible light emission abound, the best supported theory being the quantum confinement model. This model has been validated by theoretical calculations that predict higher direct energy band gaps as cross sectional wire dimensions decrease into the nanoscale regions, see V. Lehman and U. Gosele, *Appl. Phys. Lett.*, 58, 856 (1991); F. Koch, V. Petrov-Koch, and T. Muschik, *J. of Luminescence*, 57, 271 (1993); G. D. Sanders and Y. -C. Chang, *Phys. Rev. B*, 45(16) (1992) 9202; and T. Ohno, K. Shiraishi and T. Ogawa, *Phys. Rev. Lett.* 69(16) (1992) 2400. Research in the field has attempted to verify these predications by fabricating vertical nanowire structures (columns) in bulk silicon and measuring the photoluminescent light output of these columns, see H. I. Liu, N. I. Maluf, R. F. W. Pease, D. K. Biedelsen, N. M. Johnson, F. A. Ponce, *J. Vac. Sci. Technol. B*, 10(6) (1992) 2846.

Practical device structures of either porous silicon quantum wires or of silicon vertical columns have however been unattainable in part due to the difficulty of precise control of nanostructured dimensions as well as due to difficulties in making efficient electrical contact to the fragile nanostructures.

Other quantum effect devices, such as the lateral resonant tunnelling field-effect transistors, have been modeled in GaAs and AlGaAs, see S. Y. Chou, J. S. Harris and R. F. W. Pease, *Appl. Phys. Lett.*, 52(23) (1988) 1982. However effectively implementing such lateral nanostructures in a silicon-based technology has not yet been achieved in the prior art.

A need exists for silicon-based nanostructures whose dimensions are precisely controlled for optimizing light-emitting properties, whose structure is well supported to decrease nanostructure breakage, whose configuration is amenable to the making of good electrical connection, and whose material make-up is compatible with other silicon-based electronics.

SUMMARY OF THE INVENTION

A preferred embodiment of the invention is a single crystal silicon film nanostructure laterally disposed on an insulating substrate of sapphire and the method of fabricating the same. The height, width and length of the nanostructure is precisely controlled. What is meant by "laterally disposed" is that an area of the nanostructure created by its width and length lies adjacent the substrate upon which the structure is placed. By laterally disposing a silicon-based nanostructure on a substrate, adequate support for the structure is provided, and the option of fabricating efficient electrical contact structures to the silicon-based nanostructures is possible. The lithographically defined, single crystal, silicon-based nanostructures can be made an integral part of silicon-based photo, electroluminescent, and quantum-effect devices all of which are compatible with current silicon manufacturing techniques and with other silicon-based microelectronics. The insulating, etch resistant substrate provides a high degree of control and flexibility in the fabrication of the nanowire structures, permitting the exploitation of both the width and vertical confinement dimensions of the single crystal silicon film. The insulating characteristics of the sapphire substrate are superior to that of a silicon-based substrate thereby minimizing current leakage shortcomings. Also compared to a silicon base, the sapphire base permits greater vertical (height) dimensional control of the silicon-based nanostructures as the sapphire base is resistant to chemicals used to make the vertical size reductions of the silicon nanostructure. An additional advantage of a sapphire base is that it permits and encourages the growth of silicon nanostructures of single crystal form. These can be readily integrated with other silicon-based electronic devices whether such integration be done monolithically or separately, thereby simplifying manufacturing and enhancing reliability. The sapphire base also promotes a high degree of uniform oxide growth, especially at nanostructure corners, resulting in an enhanced degree of nanostructure dimensional control. An additional feature of a sapphire base is that its transparent characteristic permits photonic devices placed upon the substrate to accept light from many directions and permits photonic emission from the photonic devices to be viewed from many directions.

According to a preferred embodiment of the invention, the method for forming laterally disposed nanostructures of silicon on an insulating sapphire substrate begins with an insulating sapphire substrate. Ultrathin layers of silicon are deposited on the substrate. A Solid Phase Epitaxy improvement process is then used to remove crystalline defects formed during the silicon deposition process. The silicon is subsequently annealed and thinned using successive thermal oxidation steps to reduce its thickness. The resulting thickness of the silicon layer on the insulating sapphire substrate is on the order of five (5) nanometers in height.

Width and length dimensional control of the nanostructures is accomplished by lithography. The nanometer dimensioned silicon (nanosilicon) is spin-coated with a resist. Width and length definition in the resist is preferably performed by way of electron beam exposure. The photo resist is then developed and the e-beam written pattern is subsequently transferred to the nanosilicon in an etching process. Repeated oxidations and etchings may subsequently be employed to further thin the width of the nanostructure so that resulting nanostructure width dimensions are on the order of two to three nanometers.

OBJECTS OF THE INVENTION

It is an object of this invention to provide a method for fabricating nanostructures that offers precise dimensional control of the nanostructures fabricated.

A further object of this invention is to provide nanostructures that are relatively rugged and sturdy.

Yet another object of this invention is to provide nanostructures that are amenable to good electrical contact.

Yet a further object of this invention is to provide nanostructures of a material compatible with silicon-based electronics and manufacturing processes.

A further object of this invention is to provide a nanostructure on a base that contributes minimally to nanostructure current leakage.

Yet another object of this invention is to provide a nanostructure on a base that is substantially transparent to photonic emission and radiation.

Other objects, advantages, and new features of this invention will become apparent from the following detailed description of the invention when considered in conjunction with the accompanied drawings.

DESCRIPTION OF THE PREFERRED EMBODIMENT

Figure 1:
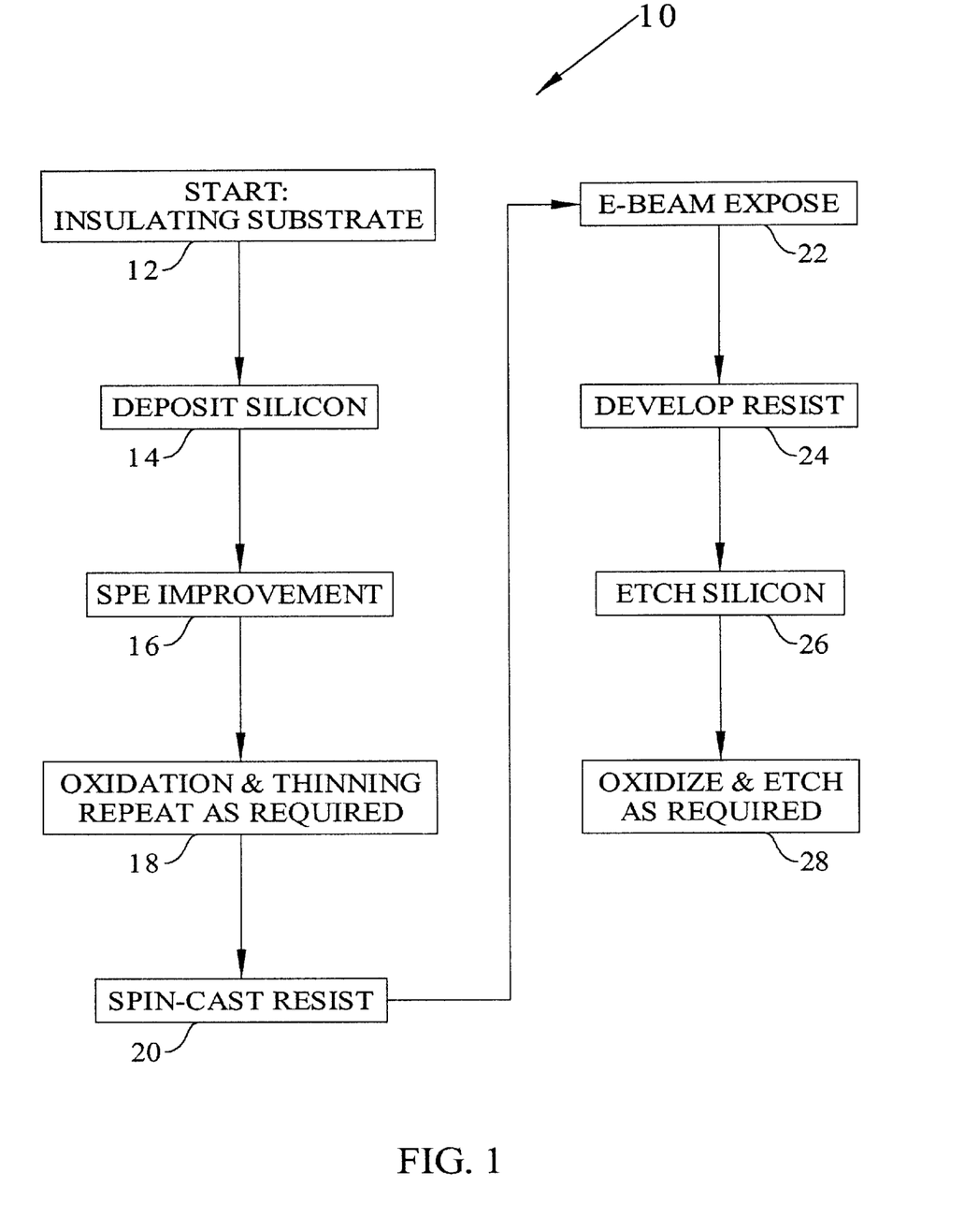
FIG. 1 is a schematic of a representative process as may be used to fabricate nanostructures according to the invention.

Referring now to FIG. 1, a representative process 10 for making lateral nanostructures on an insulating substrate is shown.

Process 10 begins by starting with an insulating substrate 12. In a preferred embodiment of the invention, this substrate is of sapphire; however, other substrates, such as glass, quartz, fused silica, spinel, magnesium oxide, magnesium fluoride, diamond, yttria-stabilized zirconium (YSZ), ruby (chromed doped sapphire $Cr:Al_2O_3$), yttria alumina garnet (YAG), can be used. As indicated above, sapphire has characteristics that are advantageous to certain nanostructure fabrication.

Step 14 of process 10 is the deposition of silicon on the insulating substrate base. In a preferred embodiment of the invention, ultra thin (less than 100 nanometers) layers of silicon are fabricated on the substrate. Single crystal silicon of a thickness of about 0.3 micrometers is deposited on the ($1\bar{1}02$) crystal plane of sapphire by the pyrolysis of silane near 1000° C. In step 16 microtwin defects, which arise from a thermal expansion mismatch between the silicon and sapphire, are removed using a solid phase epitaxy process. The prior art describes one such process known as Double Solid Phase Epitaxy (DSPE), see G. A. Garcia, R. E. Reedy, Elect. Lett., 22 (1986) 537. In the preferred embodiment of the invention $Si^{28}$ ions are implanted in the as-deposited silicon layer at 185 keV with a dose of $6.0 \times 10^{14}/cm^2$ at a wafer temperature of about −20° C. In step 18 of FIG. 1, the silicon is subsequently annealed and thinned using successive thermal oxidation steps to reduce its thickness.

In a preferred embodiment of the invention this annealing treatment occurs at 900° C. for about 1 hour followed by a wet oxidation at 1000° C. for about 50 minutes. This forms an oxide ($SiO_2$) thickness of about 280 nanometers which partially consumes the silicon. The initial oxide is then removed using a buffered oxide etchant, hydrofluoric acid or equivalent remover. A second thinning oxide is then grown in a wet oxygen ambient at 875° C. for about 50 minutes. This produces an oxide of about 70 nanometers thickness which is subsequently etched off to reduce the silicon layer thickness to about 90 nanometers. A third wetting oxidation is then performed at 875° C. for about 2 hours forming an oxide layer of about 160 nanometers thickness. After removing this oxide, the resulting silicon layer thickness (vertical height) on the insulating sapphire substrate is on the order of 5 nanometers.

Minor variations in this process could further affect control of vertical dimensions below 100 nanometers, hereafter described as nanoscaled dimensions, and the resulting silicon of these dimensions hereafter being termed "nanosilicon". Film thickness may be measured using techniques practiced in the microelectronics industry including ellipsometry, stylus profilometry, and/or atomic-force microscopy (AFM). The control of the vertical dimension of a nanostructure by variation of film thickness affords superior flexibility in the design of quantum-effect devices.

Subsequently, the width and length dimensions of the nanostructures are defined using, in a preferred embodiment of the invention, lithographic techniques amenable with nanoscale dimensions such as electron beam (e-beam), x-ray lithography, and the like. The laterally disposed nanostructures are fabricated in the nanoscale single-crystal silicon film (nanosilicon) lying on top of the sapphire substrate. In step 20 of FIG. 1, the nanosilicon is preferably spin-coated with 275 nanometers of polymethyl methacrylate (PMMA) photoresist and is baked for 3 hours at about 157° C. The resist-coated samples are subsequently flashed with 10 nanometers of gold to prevent charge buildup during e-beam writing. Referring to step 22 of FIG. 1, width and length definition in the resist is performed with a JEOL JSM-6400 scanning electron beam microscope with a tungsten filament and a 3 nanometer spot size. Magnification of 2000× is used and a beam current of about 10 picoamps is employed. Electronbeam dwell times ranged from 13 to 16 microseconds. The e-beam was directed onto the positive photoresist in the regions where silicon was desired to be removed. The gold layer was subsequently stripped in a KI:I (Potassium Iodide:Iodine) etch (4 gm KI, 1 gm I, 150 ml deionized water) which had an etch rate of about 25 nanometers per minute.

Referring again to Process 10 of FIG. 1, step 24 includes development of the photoresist by immersion in methyl ethyl ketone:ethanol (3:1) for 25 seconds, isopropyl:methyl isobutyl ketone for 10 seconds, and finally 10 seconds in isopropyl alcohol. This produced a masking structure (pattern) to be replicated in the nanosilicon layer below.

Figure 2:
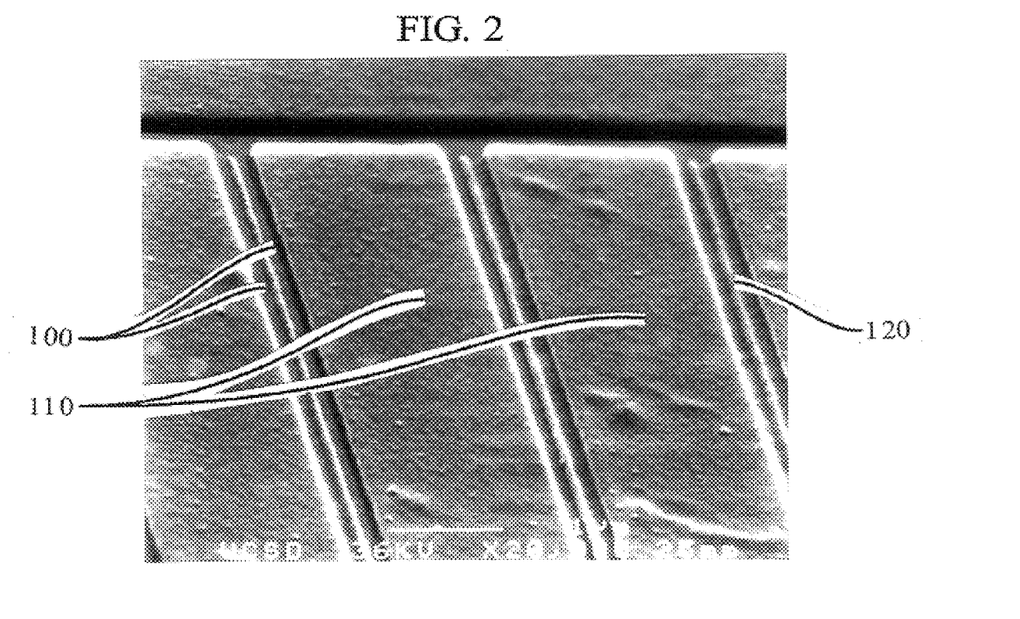
FIG. 2 shows pairs of 100-nanometer-wide lines written by electron beam in photo resist with 100-nanometer spacing used to form the nanostructures of the invention.

Referring to FIG. 2 this figure shows pairs of 100-nanometer-wide lines (element 100) written by e-beam in photoresist 110 with 100 nanometer spacing (120) used to form the nanostructures according to the invention.

Step 26 of Process 10 of FIG. 1 is the step where the e-beam written pattern in the photoresist is subsequently transferred to the nanosilicon using an etching process. Reactive ion etching or plasma etching are "dry" techniques practice in the art of microelectronic fabrication which may be employed along with monolayer etching, see D. J. D. Sullivan, H. C. Flaum and A. C. Kummel, *J. Phys. Chem.*, 97, 12051 (1993), by controlled absorption of reactants on the semiconductor surface with subsequent desorption of the reacting byproducts. In this embodiment, given by way of example, reactive ion etching was performed for 3 minutes at 12 watts in an ambient containing a partial pressure of 0.01 milliTorr oxygen and 14 milliTorr of $CCl_2F_2$. The PMMA photoresist can then be stripped in a methanol/acetone (1:1) solution resulting in lateral nanostructures defined in the nanosilicon layer. Stripping of the photoresist may not be necessary in cases where optical illumination is used to stimulate an optical emission from the silicon nanostructure.

Figure 3:
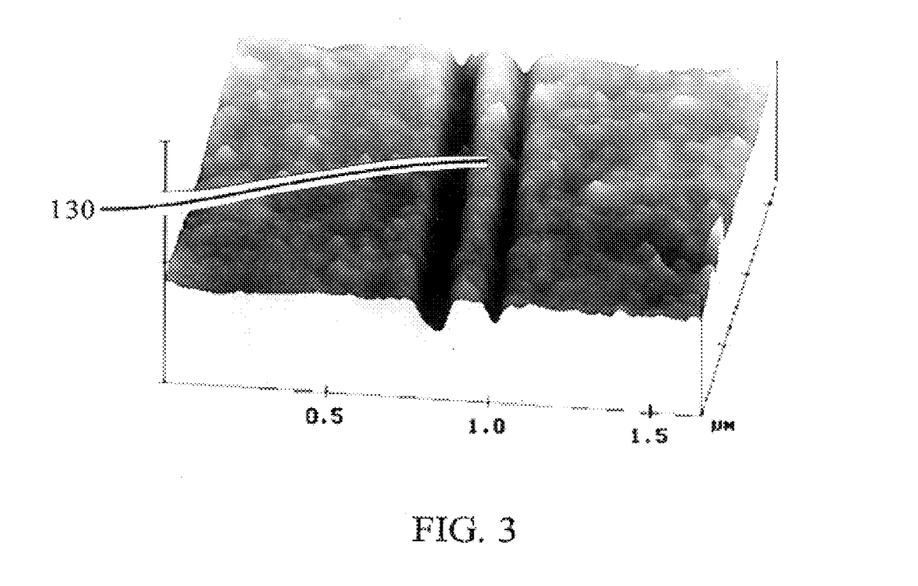
FIG. 3 is an atomic force microscopy representation of a single crystal silicon nanowire, fabricated according to the process of the invention.

FIG. 3 shows an AFM representation of a single crystal silicon "nanowire" 130 fabricated using the process of the invention.

Referring once again to FIG. 1, Process 10 continues with step 28 in which repeated oxidations using either furnace or native oxidation may be subsequently employed to further thin the width of the nanostructures to, for example, 2 to 3 nanometer width dimensions.

In the case of photonic silicon devices containing these nanostructures, the light output can be observed through conventional fluorescence microscopy, near-field fluorescence spectroscopy, see X. S. Xie, E. V. Allen, G. R. Holtom and R. C. Dunn, *SPIE Proceedings* 1994, 2137 (1994), and the like. Mechanical, electrical or optical contact to any portion of the nanostructure may then be easily performed due to the placing of the nanostructures laterally on the mechanically-supporting insulating substrate. In the case of light-emitting nanowires on sapphire, electrical contact may be made to generate electroluminescence with light emission visible from above and below the transparent substrate. Various surface treatments can be performed to enhance or quench the luminescence and to passivate or protect the nanostructures.

Figure 4:
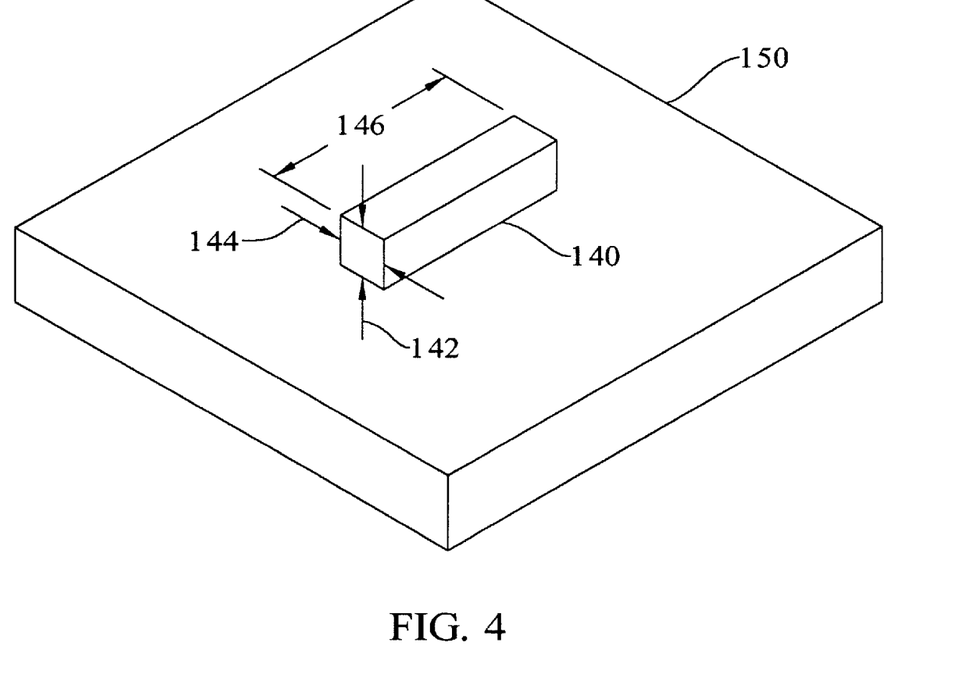
FIG. 4 shows a generic nanostructure fabricated in nanosilicon on an insulating substrate.
Figure 5:
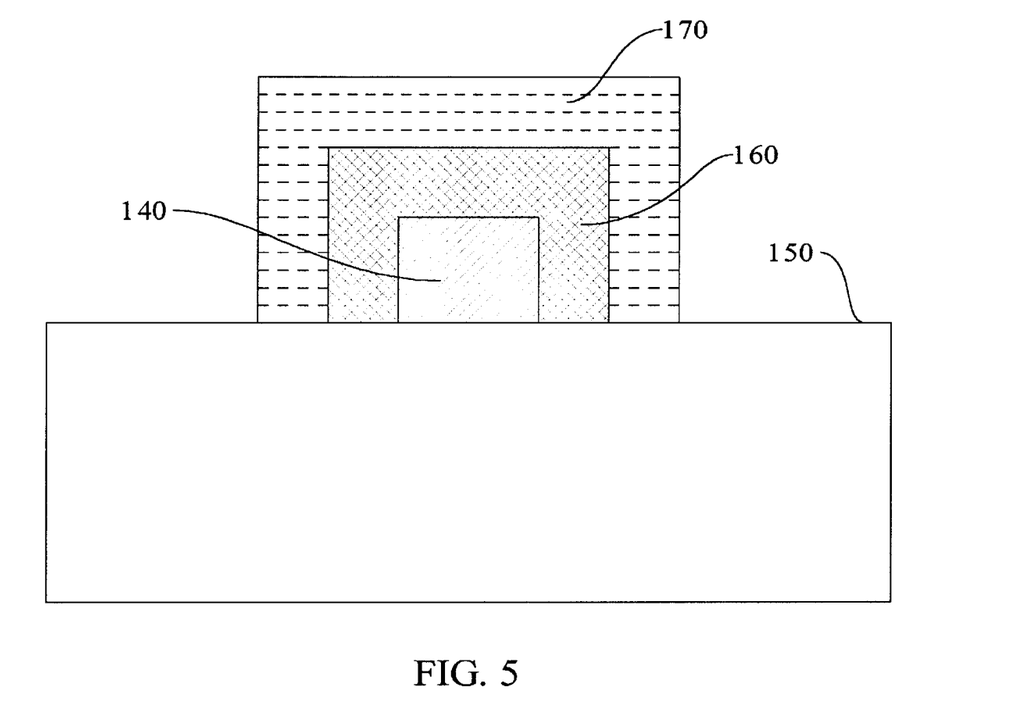
FIG. 5 is similar to FIG. 4 but shows the addition of a barrier layer between a metal conducting layer and the nanosilicon layer.
Figure 6:
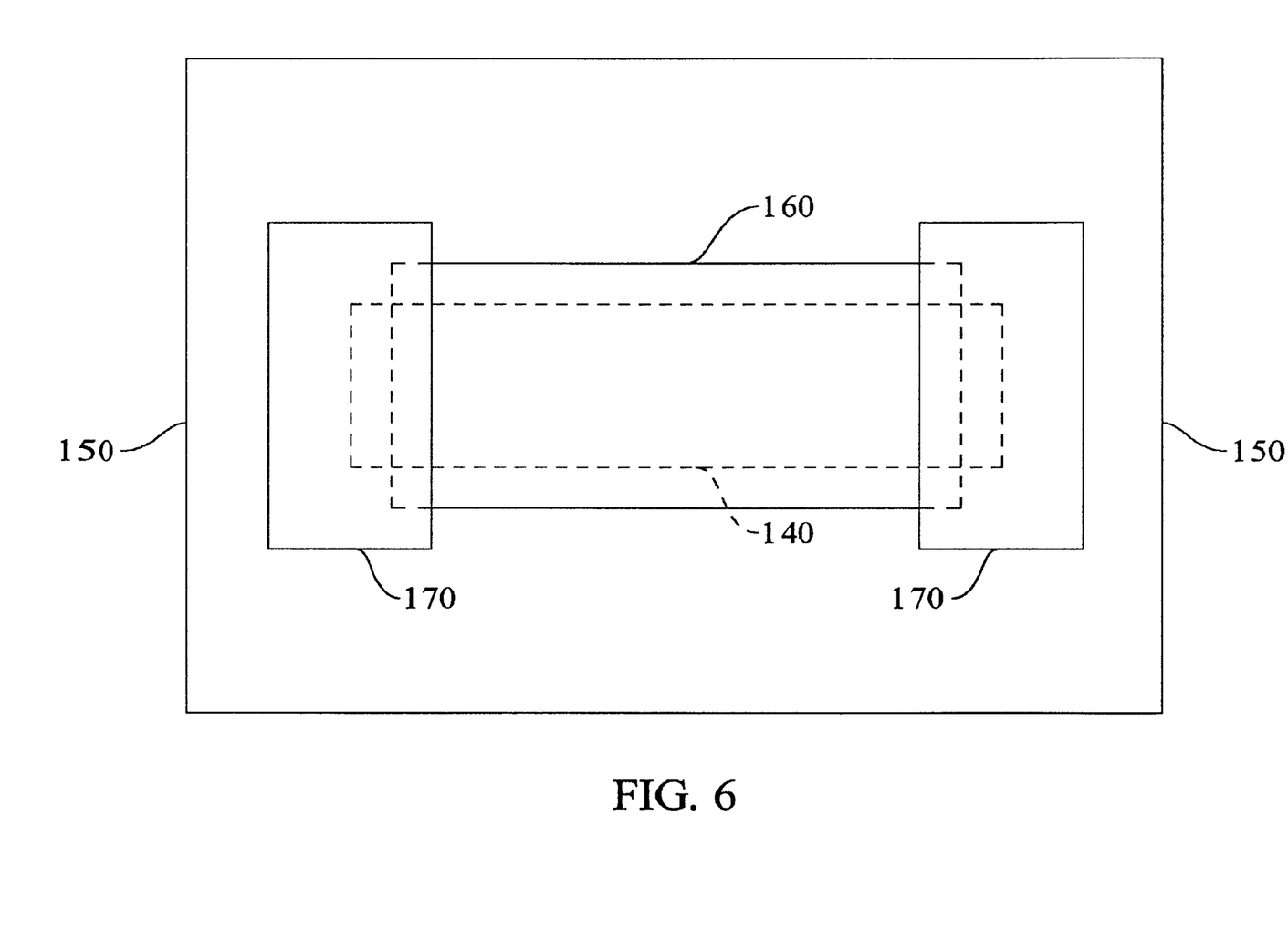
FIG. 6 is a top view illustrating utilization of an insulator barrier to prevent electrical contact at a given portion of the nanowire.

FIG. 4. schematically shows a generic cross-section of a nanostructure 140 (nanowire) fabricated of single-crystal silicon of nanoscale thickness dimensions (nanosilicon) on an insulating substrate 150. Nanowire 140 has height 142, width 144 and length 146. According to the invention, height and width dimensions of 1–100 nanometers are considered reachable with nanostructure lengths of as little as 1 nanometer being possible. Laterally disposed nanostructures, may have, for example, lengths that are typically at least as long as the greater of the height and width of the silicon nanostructure. In FIG. 5, a barrier layer 160 which can be used to prevent electrical contact at a given portion of nanowire 140 and/or can be used to prevent diffusion of a metal conductor 170 into silicon layer 140 is shown. FIG. 6. shows a top view of insulating base 150 upon which silicon nanowire 140 is contacted by electrically conducting contacts 170 with barrier layer 160 protecting what would otherwise be an exposed section of nanowire 140.

Modifications to the cross-sectional profile of FIG. 5 to include sidewall insulators and barriers or other multilayers can be easily accommodated by the process of the invention.

Figure 7:
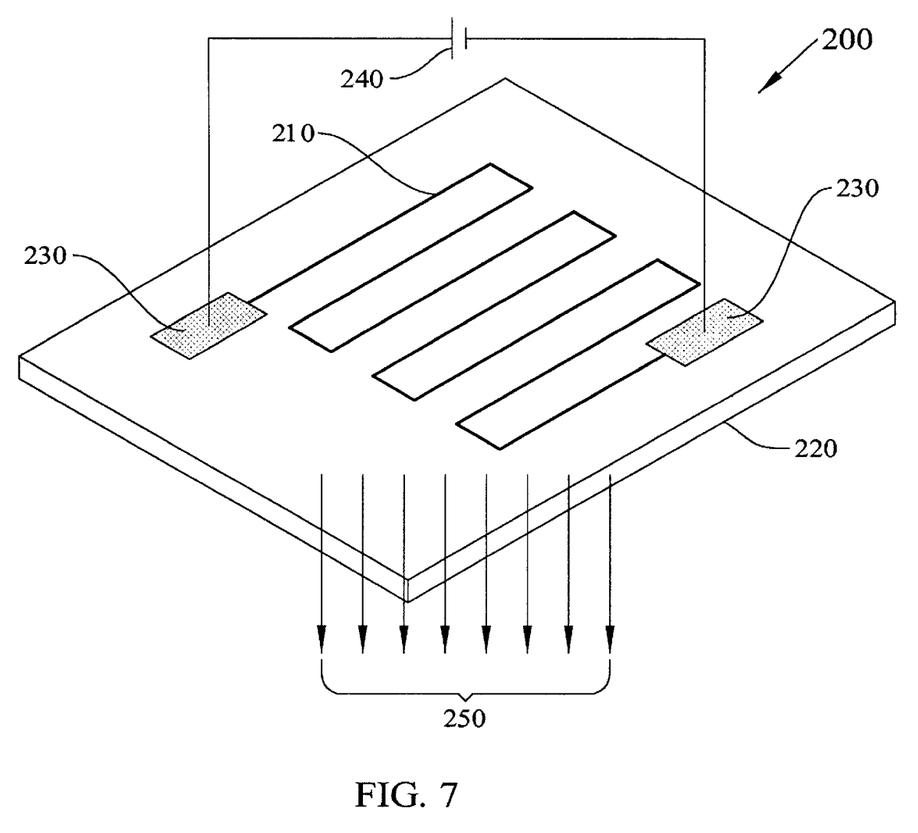
FIG. 7. Shows a generalized embodiment of a serpentine-shaped electroluminescent device incorporating electrical contact structures.

Referring to FIG. 7 an embodiment of an electroluminescent device 200 is shown incorporating silicon nanowires 210 on an insulating base 220. Serpentine nanowires 210 are monolithically connected to electrical contact pads 230. Application of voltage source 240 to the pads results in optical emission 250.

The silicon nanostructures of the invention may also be stimulated optically. In this regard a transparent base would permit the nanostructure to be illuminated either above or below the base with emission possible from either direction. Sapphire has transparent properties that permits such two-way transmission. Besides this, the use of sapphire as a insulating substrate offers excellent dielectric isolation, superb thermal conductivity, high rigidity, flatness, hardness, and resistance to chemicals. As indicated above though, a variety of silicon on insulator (SOI) substrates may be used. In addition, the silicon itself may be varied, having degrees of crystallinity ranging from single crystal silicon material, to polycrystalline silicon or amorphous silicon. Variations in the composition of the silicon layer on the insulating substrate are also envisioned including silicon alloyed with carbon, germanium, tin, a donor impurity, an acceptor impurity, and the combination of donor and acceptor impurities.

Variations in the oxidation processes, etching of oxide and silicon layers, processing of photoresist layers and the like will also be evident to one skilled in the art of microelectronic fabrication in view of the above teaching.

The fabrication of nanostructures in silicon on insulator offers compatibility with advanced microelectronic technology (bipolar, BiCMOS, NMOS, PMOS, and CMOS) demonstrated in conventional SOI technologies. Furthermore, integration with opto-electronics, electro-mechanical devices/circuits and the like is readily provided by the lateral disposition of the nanostructure. Silicon on insulator technologies (including Silicon On Sapphire (SOS), Bond and Etchback Silicon On Insulator (BESOI), SIMOX, BESOS, and Silicon On Quartz (SOQ)) are proven materials for fabrication of integrated circuitry. They have several distinct advantages over bulk silicon for high speed, radiation hardness, high temperature and cryogenic temperature operations, as well as other various applications. In electronic circuits SOI has intrinsically lower parasitic capacitances and provides superior device isolation.

Obviously, many modifications and variations of the invention are possible in light of the above teaching. It is therefore to be understood that within the scope of the appended claims the invention may be practiced otherwise than as has been specifically described.

What is claimed is:

1. An apparatus comprising:
   a transparent substrate; and
   a silicon structure disposed on said transparent substrate, said silicon structure having a height lying in the range of 1–100 nanometers; a width lying in the range of 1–100 nanometers; and a length at least as long as the greater of the height and width of said silicon structure, said silicon structure disposed so that an area created by its length and width lies adjacent said transparent substrate.

2. An apparatus according to claim 1 in which said silicon structure can optically emit.

3. An apparatus according to claim 1 in which said transparent substrate is an insulator.

4. An apparatus according to claim 3 in which said silicon structure can optically emit.

5. An apparatus according to claim 3 in which said transparent substrate is a sapphire substrate.

6. An apparatus according to claim 5 in which said silicon structure can optically emit.

7. An apparatus according to claim 5 in which said transparent sapphire substrate has a $1\bar{1}02$ crystal plane.

8. An apparatus according to claim 7 in which said silicon structure is single crystal silicon.

9. An apparatus according to claim 1 in which said transparent substrate is selected from a material of the group consisting of: sapphire, glass, quartz, fused silica, spinel, magnesium oxide, magnesium fluoride, diamond, yttria-stabilized zirconium (YSZ), ruby (chromed doped sapphire Cr:Al$_2$O$_3$), and yttria alumina garnet (YAG).

10. An apparatus according to claim 1 in which said silicon structure is selected from a silicon crystal group consisting of: single crystal silicon; polycrystalline silicon; and amorphous silicon.

11. An apparatus according to claim 9 in which said silicon structure is selected from a silicon crystal group consisting of: single crystal silicon; polycrystal silicon; and amorphous silicon.

12. An apparatus according to claim 1 in which said silicon structure is selected from a material of the group consisting of: pure silicon; silicon alloyed with carbon; silicon alloyed with germanium; silicon alloyed with tin; silicon containing an acceptor impurity; silicon containing a donor impurity; and silicon containing a combination of acceptor and donor impurities.

13. An apparatus according to claim 1 further including electrically conducting pads operably coupled to said silicon structure.

14. An apparatus according to claim 1 in which said silicon structure is operably coupled to any of the group consisting of: insulators, semiconductors, metals, electronic devices, electronic circuits, optical devices, optical circuits, electro-mechanical devices, electro-mechanical circuits, electro-optical devices and electro-optical circuits.

15. An apparatus comprising:
    a transparent insulating sapphire substrate having a $1\bar{1}02$ crystal plane; and
    an optically emissive single crystal silicon structure disposed on said $1\bar{1}02$ crystal plane of said transparent substrate, said silicon structure having a height lying in the range of 1–100 nanometers; a width lying in the range of 1–100 nanometers; and a length at least as long as the greater of the height and width of said silicon structure, said silicon structure disposed so that an area created by its length and width lies adjacent said transparent substrate.

16. An apparatus according to claim 15 further including electrically conducting pads operably coupled to said silicon structure.

17. An apparatus according to claim 15 in which said silicon structure is operably coupled to any of the group consisting of: insulators, semiconductors, metals, electronic devices, electronic circuits, optical devices, optical circuits, electro-mechanical devices, electro-mechanical circuits, electro-optical devices and electro-optical circuits.

18. An apparatus comprising:
    a silicon structure disposed on a transparent substrate, said silicon structure having a portion thereof of a dimension that permits said portion to exhibit a quantum effect, in which said portion has a surface in contact with said transparent substrate and in which said portion extends above said transparent substrate a distance no greater than any dimension of said surface that is in contact with said transparent substrate.

19. An apparatus according to claim 18 in which said silicon structure can optically emit.

20. An apparatus according to claim 18 in which said transparent substrate is an insulator.

21. An apparatus according to claim 20 in which said silicon structure can optically emit.

22. An apparatus according to claim 20 in which said transparent substrate is a sapphire substrate.

23. An apparatus according to claim 22 in which said silicon structure can optically emit.

24. An apparatus according to claim 22 in which said transparent sapphire substrate has a $1\bar{1}02$ crystal plane.

25. An apparatus according to claim 24 in which said silicon structure is single crystal silicon.

26. An apparatus according to claim 18 in which said transparent substrate is selected from a material of the group consisting of: sapphire, glass, quartz, fused silica, spinel, magnesium oxide, magnesium fluoride, diamond, yttria-stabilized zirconium (YSZ), ruby (chromed doped sapphire Cr:Al$_2$O$_3$), and yttria alumina garnet (YAG).

27. An apparatus according to claim 26 in which said in which said silicon structure is selected from a silicon crystal group consisting of: single crystal silicon; polycrystalline silicon; and amorphous silicon.

28. An apparatus according to claim 18 in which said in which said silicon structure is selected from a silicon crystal group consisting of: single crystal silicon; polycrystalline silicon; and amorphous silicon.

29. An apparatus according to claim 18 in which said silicon structure is selected from a material of the group consisting of: pure silicon; silicon alloyed with carbon; silicon alloyed with germanium; silicon alloyed with tin; silicon containing an acceptor impurity; silicon containing a donor impurity; and silicon containing a combination of acceptor and donor impurities.

30. An apparatus according to claim 18 further including electrically conducting pads operably coupled to said silicon structure.

31. An apparatus according to claim 18 in which said silicon structure is operably coupled to any of the group consisting of: insulators, semiconductors, metals, electronic devices, electronic circuits, optical devices, optical circuits, electro-mechanical devices, electro-mechanical circuits, electro-optical devices and electro-optical circuits.

* * * * *